United States Patent
Liu et al.

(10) Patent No.: US 6,917,073 B2
(45) Date of Patent: Jul. 12, 2005

(54) ONO FLASH MEMORY ARRAY FOR IMPROVING A DISTURBANCE BETWEEN ADJACENT MEMORY CELLS

(75) Inventors: Mu-Yi Liu, Taichung (TW); Chih-Chieh Yeh, Taipei (TW); Tso-Hung Fan, Banciao (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/643,877

(22) Filed: Aug. 20, 2003

(65) Prior Publication Data

US 2005/0040458 A1 Feb. 24, 2005

(51) Int. Cl.[7] .............................................. H01L 29/792
(52) U.S. Cl. ........................ 257/324; 257/411; 438/286
(58) Field of Search .................................. 257/324, 411; 438/286

(56) References Cited

U.S. PATENT DOCUMENTS

| | | | | | |
|---|---|---|---|---|---|
| 5,032,881 A | * | 7/1991 | Sardo et al. | ................. | 257/316 |
| 6,664,588 B2 | * | 12/2003 | Eitan | ........................... | 257/316 |
| 2003/0160280 A1 | * | 8/2003 | Yoshino | ..................... | 257/324 |

* cited by examiner

*Primary Examiner*—Mark V. Prenty
(74) *Attorney, Agent, or Firm*—Rabin & Berdo, P.C.

(57) ABSTRACT

To reduce the disturbance between adjacent memory cells, an improved ONO flash memory array is implanted with a pocket on one side of the channel of each memory cell or two pockets of different concentrations on both sides of the channel, thereby resulting in memory cells with asymmetric pockets. Consequently, no disturbances occurred between adjacent memory cells when the ONO flash memory array is programmed or erased by band-to-band techniques, and the disturbances between adjacent memory cells are also suppressed during reading process.

3 Claims, 5 Drawing Sheets

ONO FLASH MEMORY ARRAY FOR IMPROVING A DISTURBANCE BETWEEN ADJACENT MEMORY CELLS

FIELD OF THE INVENTION

The present invention relates generally to a flash memory, and more particularly to an oxide-nitride-oxide (ONO) flash memory array capable of improving the disturbances between the adjacent memory cells thereof.

BACKGROUND OF THE INVENTION

FIG. 1 shows two memory cells 102 and 104 of a typical ONO flash memory array 100, of which an ONO layer 108 is deposited on a substrate 106, polysilicons 110 and 112 and oxide layer 126 are formed on the ONO layer 108, a bit line 114 is implanted in the substrate 106 on the right of the polysilicon 110, a bit line 116 in the substrate 106 between the polysilicons 110 and 112, a bit line 118 in the substrate 106 on the left of the polysilicon 112, buried diffusion regions 120, 122 and 124 surrounding the bit lines 114, 116 and 118 respectively, a word line 128 is connected to the polysilicons 110 and 112, a channel 130 is formed between the buried diffusion regions 120 and 122, a channel 132 between the buried diffusion regions 122 and 124.

When the conventional ONO flash memory array 100 is programmed or erased the data 136 in the ONO layer 108 of the cell 104 by band-to-band technique, as shown in FIG. 1, the adjacent cell 102 will be programmed or erased and thereby the data 134 thereof 102 will be also disturbed. Similarly, a disturbance will be introduced when the data 136 of the cell 104 is read out.

To reduce the disturbances between adjacent memory cells of an ONO flash memory array, a bias voltage is additionally applied to the sources during the programming and erasing procedures. In the cell 102 of FIG. 1, for instance, −5V is supplied to the word line 128, +5V is supplied to the bit line 116, and +3V is additionally applied on the bit line 114. However, the introduction of additional bias will increase the power consumption and complexity of control circuit. Therefore, it is desired an ONO flash memory array capable of improving the disturbances between the adjacent memory cells thereof.

SUMMARY OF THE INVENTION

An objective of the present invention is to disclose an ONO flash memory array for improving the disturbance between adjacent memory cells.

Another objective of the present invention is to disclose an asymmetric ONO flash memory cell.

In an improved ONO flash memory array, according to the present invention, there are comprised a substrate, an ONO layer on the substrate, a gate on the ONO layer, a word line on the gate, two bit lines in the substrate on both sides of the gate respectively, two buried diffusion regions in the substrate surrounding the bit lines respectively, a channel between the buried diffusion regions, two pockets are implanted on both side of the channel close to the buried diffusion regions respectively.

Alternatively, only one pocket is implanted on one side of the channel close to one of the buried diffusion regions for asymmetricity of the memory cell.

By utilizing the asymmetric pockets in each memory cell, the disturbances between adjacent memory cells are avoided when the ONO flash memory array is programmed or erased by band-to-band technique and further, the disturbances between adjacent memory cells during read-out procedure are also suppressed.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
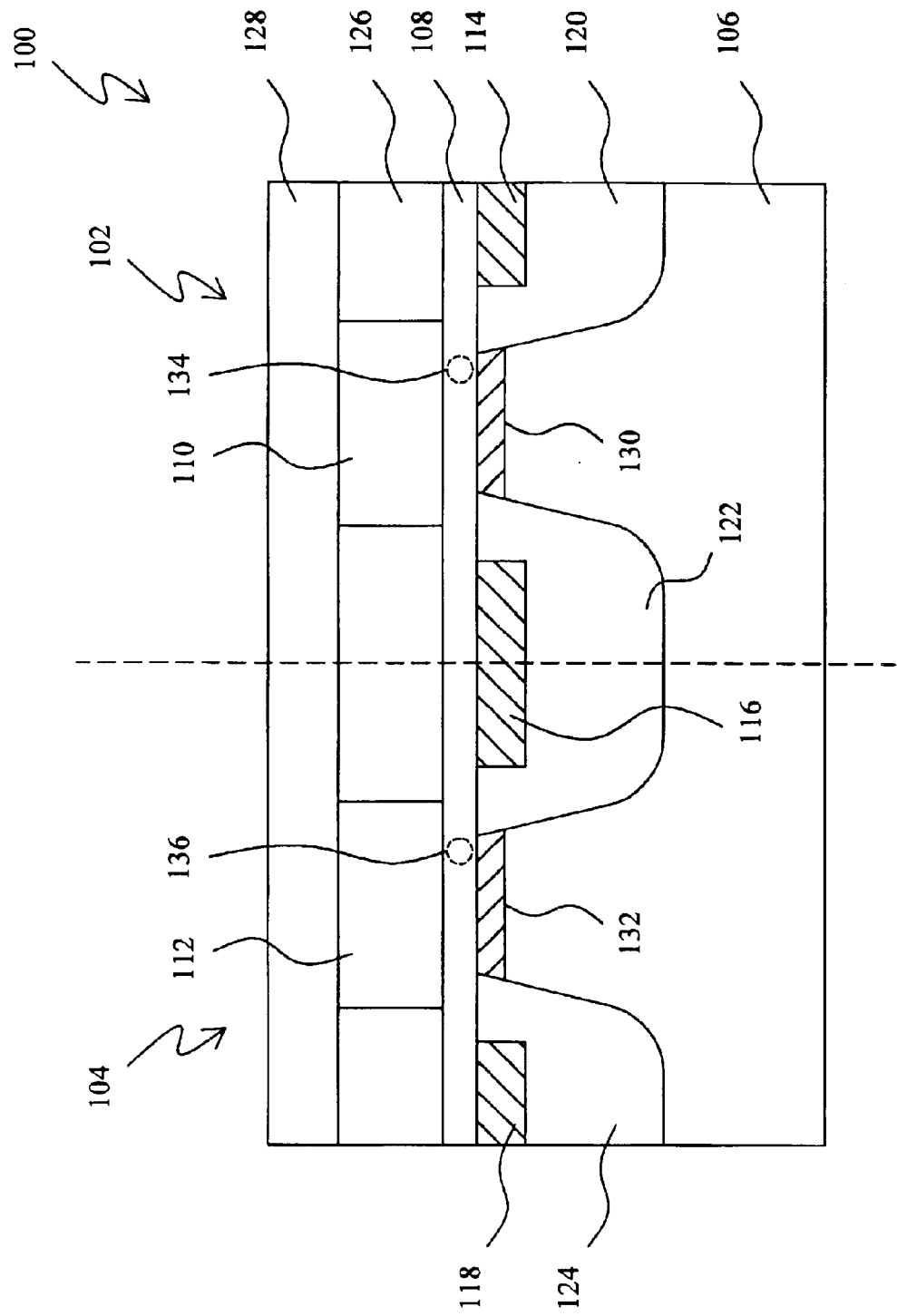
FIG. 1 is a conventional ONO flash memory array.
Figure 2:
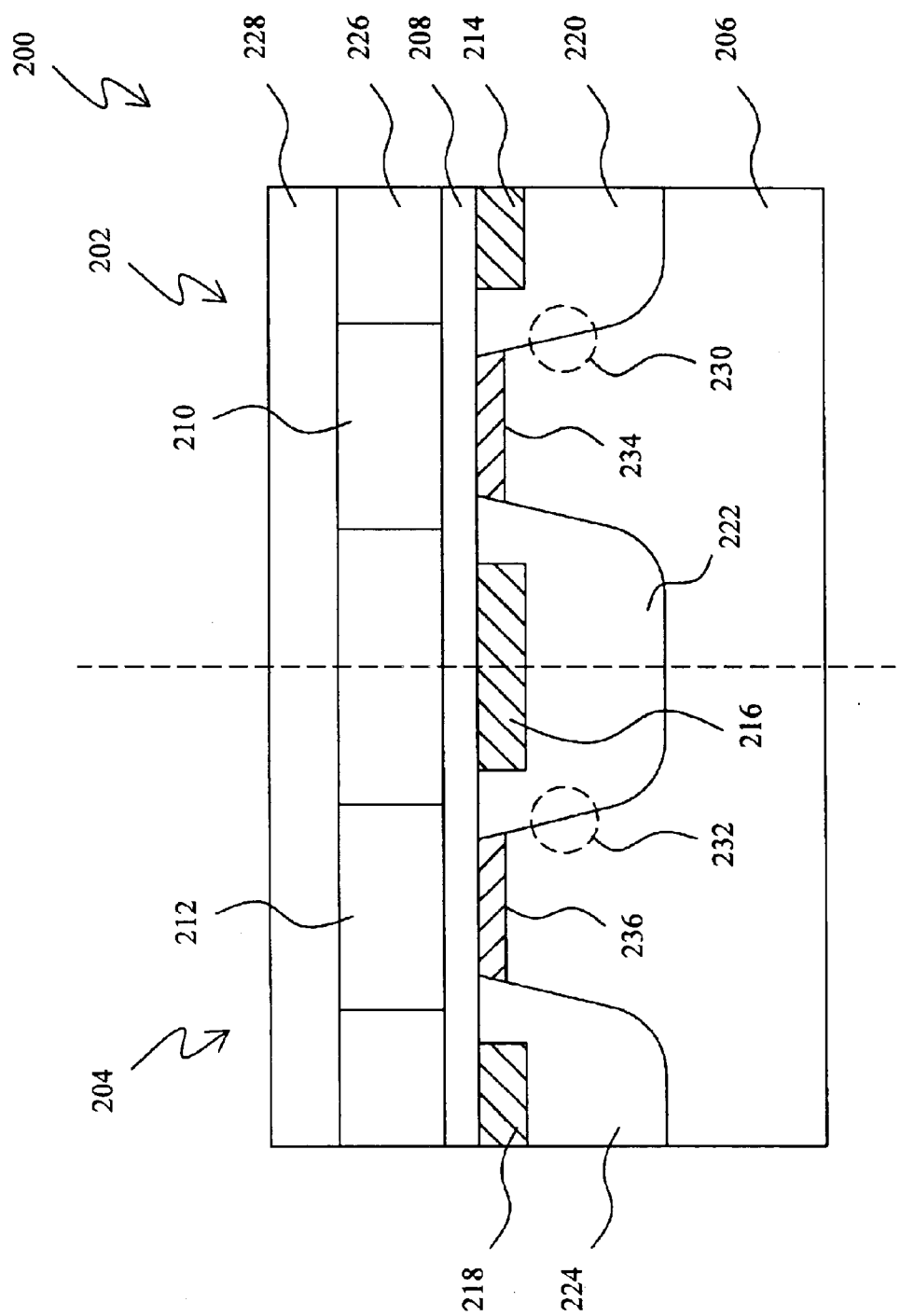
FIG. 2 is the first embodiment according to the present invention.

FIG. 2 shows two cells 202 and 204 of an ONO flash memory array 200, of which an ONO layer 208 is formed on a substrate 206, polysilicons 210 and 212 and oxide layer 226 are deposited on the ONO layer 208, a bit line 214 is implanted in the substrate 206 on the right of the polysilicon 210, a bit line 216 in the substrate 206 between the polysilicons 210 and 212, a bit line 218 in the substrate 206 on the left of the polysilicon 212, buried diffusion regions 220, 222 and 224 surrounding the bit lines 214, 216 and 218 respectively, a word Line 228 is connected to the polysilicons 210 and 212, a channel 234 is formed between the buried diffusion regions 220 and 222, a channel 236 between the buried diffusion regions 222 and 224, a pocket 230 is implanted on the right side of the channel 234 close to the buried diffusion region 220, another pocket 232 on the right side of the channel 236 close to the buried diffusion region 222.

Figure 3:
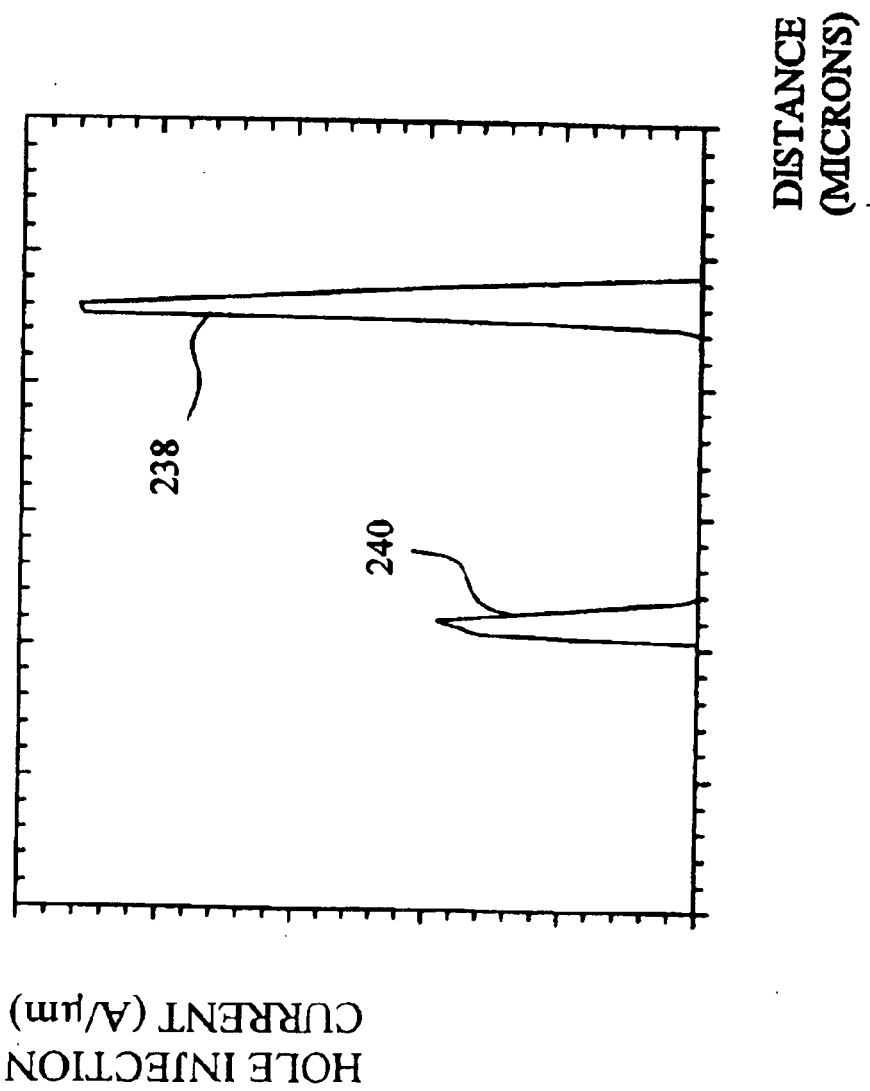
FIG. 3 shows the hole injection currents on both sides of a common bit line under band-to-band programming or erasing a memory cell.

FIG. 3 shows the hole injection currents on both sides of a common bit line under band-to-band programming or erasing a memory cell shown in FIG. 2. For the bit line 216, for example, waveforms 238 and 240 represent the hole injection currents on the left and right sides of the bit line 216. Due to the pocket 232 on the left side of the bit line 216, when applying voltage to the bit line 216 to program or erase the cell 204, the hole injection current 238 generated on the left side of the bit line 216 is more larger than that (240) on the right side of the bit line 216. For the presence of the pocket 232, larger hole injection current is generated when programming and erasing the memory cell 204, and the larger the hole injection current is generated, the faster the programming or erasing of data is performed. Consequently, when the memory cell 204 is programming or erasing, its adjacent memory cell will not be disturbed. Moreover, a better performance can be obtained if a bias voltage is additionally applied to the bit line 214. In addition, when the data of the cell 202 is read out, the disturbance thereof is also suppressed, since the possibility of impact ionization is reduced resulted from no pocket implanted on the left side of the cell 202.

Figure 4:
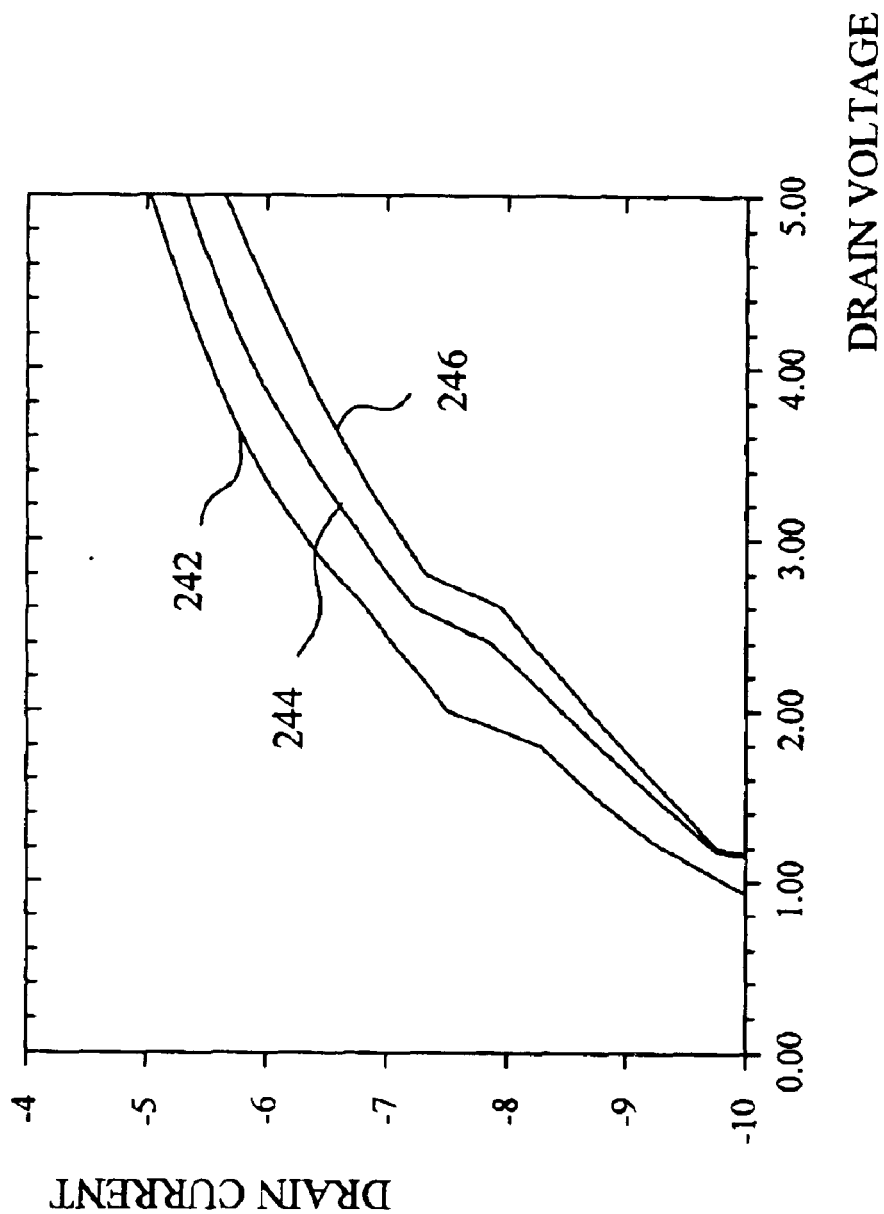
FIG. 4 shows the drain voltage to current curves when programming the memory cell of the present invention.

FIG. 4 shows the drain voltage to current curves when programming the memory cell of FIG. 2, among which curve 242 indicates the voltage to current relationship when a buried diffusion region has a pocket close thereto, curve 244 indicates the voltage to current relationship for a buried diffusion region without any pocket close thereto, and curve 246 indicates the voltage to current relationship for a buried diffusion region without pocket and a bias voltage of 3V applied to the source of the memory cell. From the curves 242–246, the drain current in the situation of a pocket implanted is larger than those without pocket, and the bias voltage on the source will enhance the performance.

Figure 5:
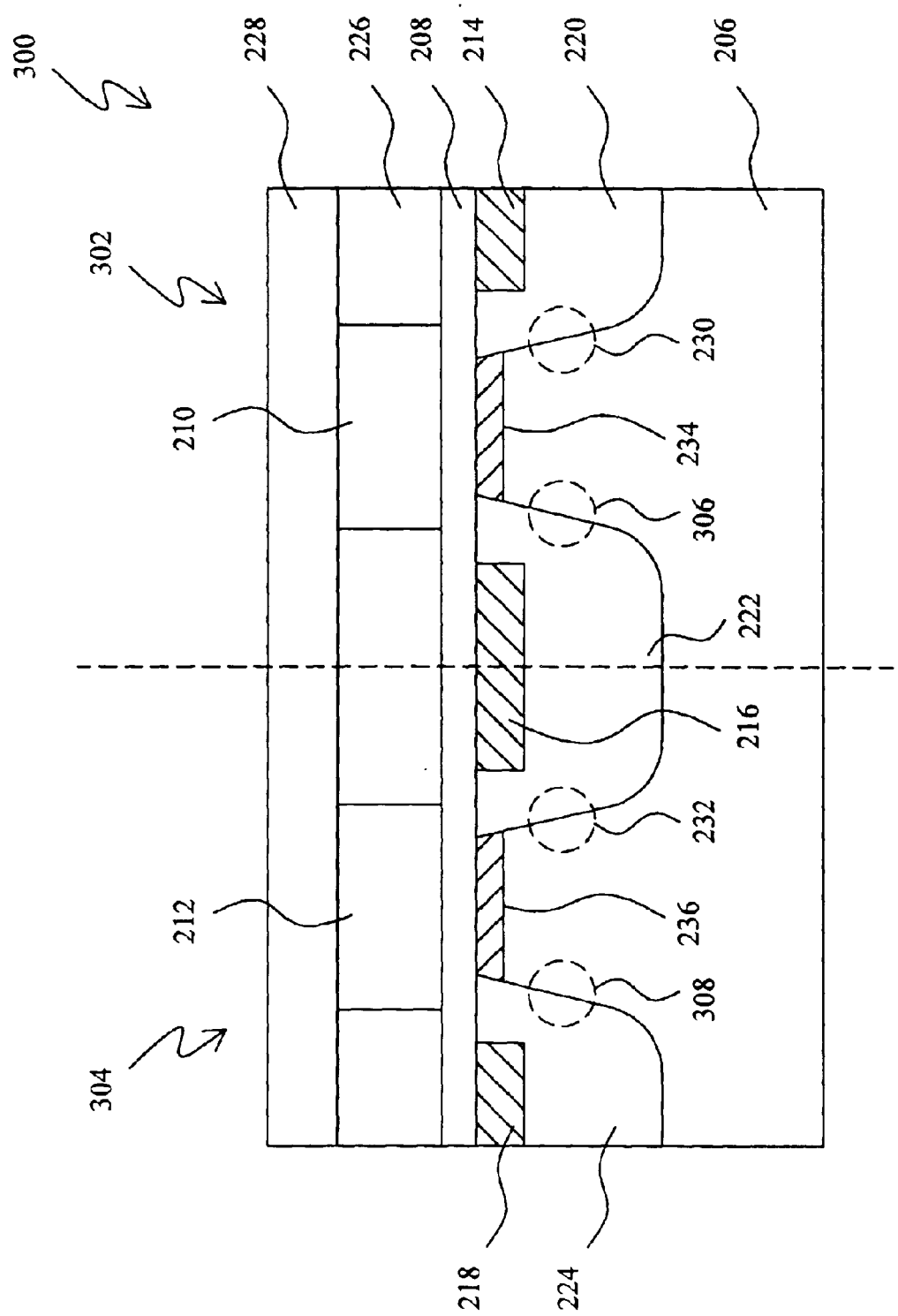
FIG. 5 is the second embodiment according to the present invention.

FIG. 5 is the second embodiment showing two memory cells 302 and 304 of a memory array 300 according to the present invention. In addition to the substrate 206, ONO layer 208, polysilicons 210 and 212, bit lines 214–218, buried diffusion regions 220–224, oxide 226, word line 228, pockets 230 and 232, and channels 234 and 236, the memory array 300 further comprises two pockets 306 and 308 on the left sides of the channels 234 and 236, respectively. However, the concentrations of the pockets 306 and 308 are lower than that of the pockets 230 and 232 respectively, such that the hole injection current generated on the right side of the bit line 216 or buried diffusion region 222 is smaller than that on the left side of the same when the cell 304 is under band-to-band programming or erasing and, as a result, the cell 302 is not disturbed. Moreover, for the same asymmetric pocket concentrations to reduce the possibility of impact ionization on the less doped pocket side, the disturbance is suppressed during the cell 302 is read.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An ONO flash memory array for reducing disturbance between adjacent memory cells, comprising:
   a substrate having first and second buried diffusion regions;
   a channel between the first and second buried diffusion regions;
   an ONO layer above the channel for memory storage;
   a first pocket of a first concentration implanted on one side of the channel close to the first buried diffusion region; and
   a second pocket of a second concentration implanted on the other side of the channel close to the second buried diffusion region, wherein the first concentration is higher than the second concentration.

2. An ONO flash memory array for reducing disturbance between first and second adjacent memory cells, comprising:
   a substrate having first and second buried diffusion regions, the second buried diffusion region having a first portion in the first memory cell and a second portion in the second memory cell;
   a channel in the first memory between the first buried diffusion region and the first portion of the second buried diffusion region;
   an ONO layer above the channel for memory storage in the first memory cell;
   a first implanted pocket at the first portion of the second buried diffusion region, the first pocket having a first concentration; and
   a second implanted pocket at the second portion of the second diffusion region, the second pocket having a second concentration that is different from the first concentration.

3. An ONO flash memory array for reducing disturbance between first and second adjacent memory cells, comprising:
   a substrate having first source/drain and second source/drain regions, the second source/drain region having a first portion in the first memory cell and a second portion in the second memory cell;
   a channel in the first memory cell between the first source/drain region and the first portion of the second source/drain region;
   an ONO layer above the channel for memory storage in the first memory cell; and
   an implanted pocket arrangement nearby the second source/drain region that is asymmetrical with respect to the first and second portions thereof,
   wherein the implanted pocket arrangement comprises a first implanted pocket at the first portion of the second source/drain region and a second implanted pocket at the second portion, the first and second implanted pockets having different concentrations.

* * * * *